United States Patent [19]
Shukla

[11] 3,735,153

[45] May 22, 1973

[54] HIGH VOLTAGE SEMICONDUCTOR PULSE

[75] Inventor: Narendra M. Shukla, Framingham, Mass.

[73] Assignee: Burroughs Corporation, Detroit, Mich.

[22] Filed: Mar. 8, 1971

[21] Appl. No.: 121,753

[52] U.S. Cl. .................................... 307/246, 307/254

[51] Int. Cl. ............................................ H03k 17/00

[58] Field of Search ........................ 330/18; 307/254, 307/252 L, 246; 317/246

[56] References Cited

UNITED STATES PATENTS

| | | | |
|---|---|---|---|
| 3,496,385 | 2/1970 | Hopkins | 307/254 |
| 3,461,319 | 9/1969 | Motto, Jr. et al. | 307/252 L |
| 3,007,061 | 10/1961 | Gindi | 307/254 |
| 3,441,875 | 4/1969 | Shoh | 330/18 X |
| 3,585,405 | 6/1971 | Stettiner | 307/252 K X |

OTHER PUBLICATIONS

Dielectric Materials & Application, 22 Contributor Edited by Hippel, John Wiley Sons, Sons N.Y., QC585C3, Vol. 6, page 41.

*Primary Examiner*—John Zazworsky
*Assistant Examiner*—B. P. Davis
*Attorney*—Kenneth L. Miller and Edwin W. Uren

[57] ABSTRACT

High voltage transistorized pulse circuit controlling a high voltage pulse as might be applied to a piezoelectric crystal for operating a hammer or a wide line high speed printer. The dimensional change of a piezoelectric crystal is a function of the potential in an application of energy which is applied to the crystal. The crystal is initially charged across its width which is transverse to the length of the crystal causing a reduction in its length thereby storing potential energy for later utilization. When the crystal is to be actuated, the crystal is discharged and the charge stored on the crystal plates is quickly dissipated through a plurality of cascaded transistorized switches. Each switch has an individual breakdown voltage rating which is proportional to the circuit voltage, therefore it is necessary to sequentially control the turning on and turning off of the individual transistorized switches to prevent the collector-emitter voltage of the several transistors from exceeding their breakdown voltage rating.

4 Claims, 1 Drawing Figure

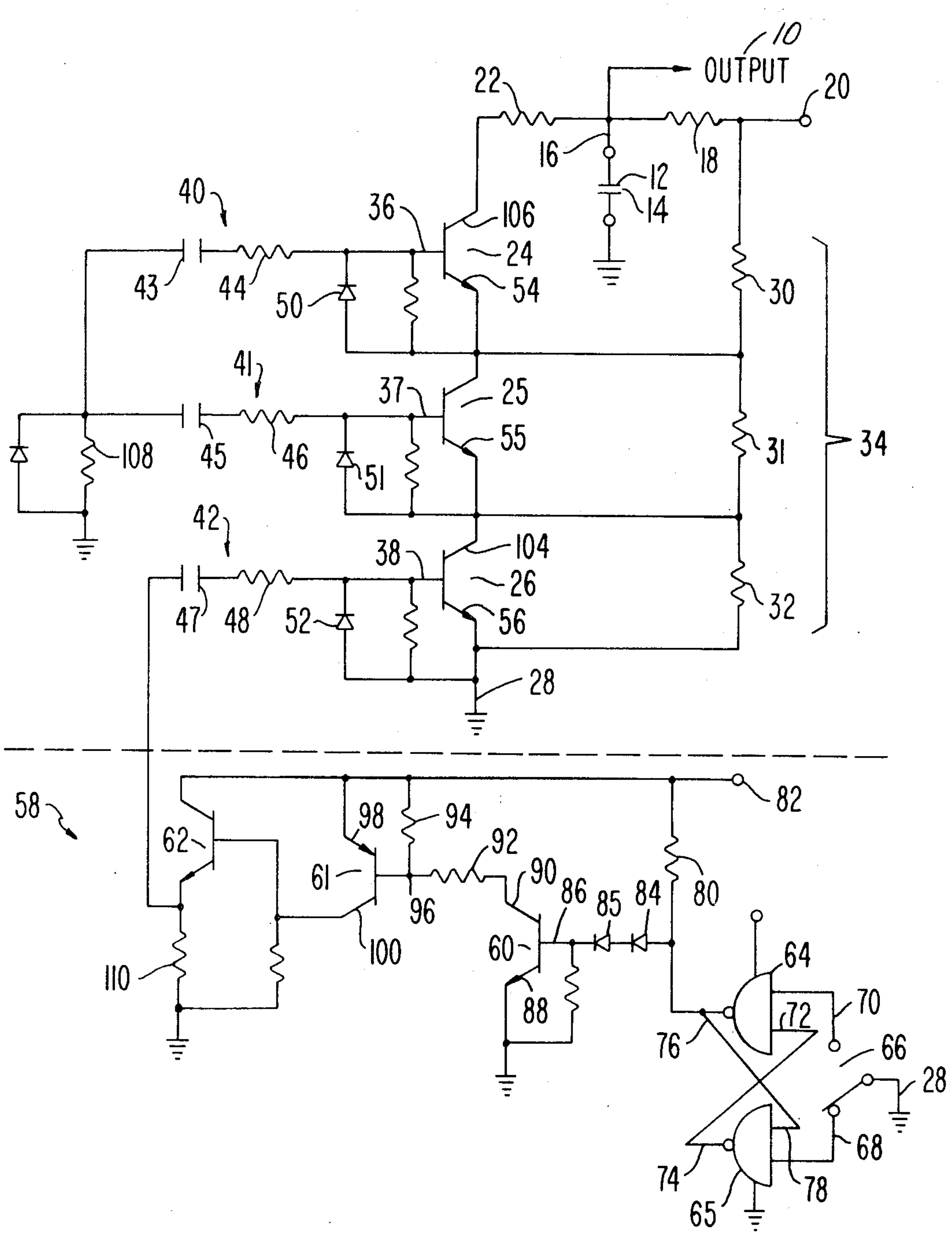
INVENTOR
NARENDRA M. SHUKLA
BY Russell C. Wells
ATTORNEY

HIGH VOLTAGE SEMICONDUCTOR PULSE

CROSS REFERENCE TO RELATED APPLICATIONS

Copending application entitled "Electrostrictive Actuator System" filed Jan. 29, 1971, Ser. No. 110,802 by Jack Beery and assigned to the same assignee as the present invention describes a utilization of the circuit described and defined herein.

BACKGROUND OF THE INVENTION

1. Field of the Invention

This invention is related to high voltage switching circuits and in particular to piezoelectric crystal switching circuits.

2. Description of Prior Art

Prior art high voltage switching circuits have used cascaded transistors as the switching elements. U.S. Pat. No. 3,007,061 issued to Gindi illustrates a circuit using cascaded transistors for switching current through a high voltage load. In order to protect the transistors during non-conduction, Gindi biases the base of each transistor, except for the transistor electrically furthest from the load, at a voltage which is proportional to the supply voltage. Each base circuit additionally contains a shunt capacitor maintaining the biased base voltage for a predetermined time after the preceeding transistor is in conduction. Actual full conduction of the switch does not take place until the shunt capacitors have discharged through the base-emitter circuit.

The patent issued to Sourgens et al., U.S. Pat. No. 2,835,829, also illustrates a circuit for individually biasing the base-emitter circuits of cascaded transistors. As in Gindi this circuit is controlled by the transistor electrically farthest from the load which both turns the switch on and off.

It is a primary object of the present invention to provide a high-voltage pulse switching circuit having a timing control means in the base circuit of each transistor for sequentially turning on and turning off circuit.

This and other objects will become apparent from the following description and definition.

SUMMARY OF THE INVENTION

In accordance with the above enumerated objects and other objects which will hereinafter become apparent, there is described and defined a high voltage semiconductor pulse circuit as may be used with piezoelectric crystal. The piezoelectric crystal has a pair of elongated broadsides which are electrically connected in a charging circuit to a source of high voltage for receiving electrostatic potential across the broadsides. The crystal in response to the potential will contract in its length dimension a predetermined amount.

The discharge circuit of said crystal comprises a plurality of cascaded semiconductors or transistors operating in a switching environment. The breakdown voltage rating between the collector and emitter of each of said transistors is substantially less than the maximum voltage across the said crystal. Therefore, in order to maintain or to balance the voltage across each of the transistors both during and when said crystal is fully charged up, and said transistors are off, a voltage divider network is provided between the source of high voltage and ground. Electrically connected in the base circuit of each transistor is a R-C timing means to control the sequential conduction of each said transistors beginning with the transistor electrically furthest from said crystal and the high voltage source. A switch control means is provided to electronically control the operation of the cascaded switches. In response to said control means, a signal is generated which is applied to said timing means for initiating the switching of said transistors. When all of said transistors are in conduction, the crystal rapidly discharges through the cascaded transistors.

DESCRIPTION OF DRAWING

In the drawing the sole FIGURE is a schematic of the high voltage semiconductor pulse circuit of the preferred embodiment.

DETAILED DESCRIPTION

Referring to the FIGURE by the characters of reference, there is illustrated in schematic representation a high voltage semiconductor pulse circuit according to the present invention. The pulse output 10 is shown as being taken off the upper plate 12 of a capacitor 14 and when used in the previously identified copending application, the capacitor is replaced by a piezoelectric crystal having a pair of electrodes electrically connected thereto. The first electrode 16 from one side of the crystal is electrically connected in a charge circuit through a current limiting charging resistor 18 to the high voltage supply 20 and in a discharge circuit through another current limiting discharge resistor 22 to a plurality of cascaded semi-conductor switches 24–26, which in the preferred embodiment are transistors. In the normal state with electrical power on, the capacitor 12 or piezoelectric crystal is electrically charged to the supply voltage 20 through the charging resistor 18. When a pulse is desired, the charge on the piezoelectric crystal is discharged through the discharge resistor 22 and the cascaded transistors to ground potential 28.

The piezoelectric crystal as might be used in the present embodiment is basically high energy high voltage device and is formed from Gulton Industries material identified as G–1512. This is lead zirconate titante material which in the preferred embodiment is 4.5 inches long, 0.5 inch wide and 0.080 inch thick and poled in the 0.080 thickness. The voltage magnitude for operating such a device is on the order of kilovolts and in the preferred embodiment, the supply voltage 20 is 3,000 volts. The crystal is charged to 3,000 volts, then when discharged, the cascaded transistors 24–26 must provide a circuit capable of discharging the current due to the 3,000 volts. In both charging and discharging, the high voltage pulse circuit must be able to control the high voltage without destruction to the circuit. In semiconductor technology at the present time, single switching units having kilovolt ratings are generally not available in quantity and when they are, they are very expensive. Therefore, it is necessary to cascade a plurality of single transistors 24–26 each having a collector to emitter breakdown voltage rating substantially less than the supply voltage. By means of cascading these individual units according to this disclosure, a high voltage semiconductor pulse circuit is provided wherein the summation of voltage ratings of each of the semiconductor switches 24–26 equals or exceeds the supply voltage and the voltage applied to each individual transistor does not exceed its breakdown rating.

In order to protect the transistors 24–26 during the charging time of the crystal 12 and when the crystal is charged, there are electrically connected in parallel to the collector-emitter circuits of each of the switching transistors, voltage balancing resistors 30–32 in a voltage divider means 34. These resistors are serially connected together and connected between the high voltage supply voltage 20 and ground potential 28 forming a voltage divider means. Since each individual resistor 30–32 has an extremely high resistance value, 1 megohm in the preferred embodiment, the standby current required from the power supply 20 through the voltage divider 34 is small. The voltage divider functions to insure that the voltage division across each transistor 24–26 is within the breakdown voltage rating of each transistor.

Electrically connected in the base circuit 36–38 of each of the transistors is a resistor-capacitor timing network 40–42 or means. It is a function of each of these networks 40–42 to supply sufficient base drive current to their respective transistors 24–26 for a predetermined period of time. It is necessary that the transistors remain in their "on" state until the charge on the piezoelectric crystal 12 is dissipated and then be turned "off" thereby eliminating excessive and unnecessary power consumption in the several circuit components. As will hereinafter be shown, the sequential order for turning the transistors 24–26 on is of prime importance. If the order of turn on is other than the predetermined order, there will be transistor failure or breakdown due to the voltage rating of the transistor being exceeded.

For ease of discussion of the operation, the following component values are used for several of the circuit components of the circuit.

| Component | Capacitance | Resistance |
|---|---|---|
| Crystal **12** | 0.003 mfd | |
| Resistor **22** | | 200 |
| Capacitor **43** | 0.005 mfd | |
| Resistor **44** | | 4K |
| Capacitor **45** | 0.01 mfd | |
| Resistor **46** | | 2K |
| Capacitor **47** | 0.47 mfd | |
| Resistor **48** | | 50 |

By applying the familiar time constant equation:

$$T = RC$$

the discharge time constant of the crystal 12 is seen to equal 0.66 microseconds. In a similar manner, the time constant in the base timing circuits 40 and 41 of the two transistors 24 and 25 electrically nearest the crystal 12 are both equal to 20 microseconds. The time constant in the base timing circuit 42 of the transistor 26 nearest ground is seen to be approximately 23 microseconds. From these times, it is seen that once the transistors 24–26 are turned on, the base circuits 40–42 discharge relatively quickly removing base current from the base leads 36–38 of the transistors. With the absence of base current, the transistors 24–26 are turned off.

As previously mentioned, the sequence order of turn on or conduction of the transistors 24–26 is important in order to prevent excessive voltage across the collector-emitter circuits of each of the transistors. In a preferred embodiment, the first or lowermost transistor 26, the one electrically furthest from the crystal is initially turned on which in turn causes the middle 25 or next succeeding transistor to turn on. As the second transistor is being turned on, the third transistor 24 begins to conduct. In this manner, the voltage across the collector-emitter circuits of each transistor does not exceed its rating.

In the normal state when the electrical power is first applied to the circuit, the crystal 12 charges up through the charging resistor 18 to the high voltage supply 20 which is 3,000 volts. Likewise each of the capacitors 43, 45 and 47 in the base circuits 40–42 of each transistor are charged through their respective diodes 50–52 to the voltage at the electrical connection between its transistor and the next adjacent transistor in the direction of decreasing voltage magnitude. In the FIGURE, this is the voltage at the emitter 54–56 of each transistor as determined by the voltage divider 34. For example, in the base circuit 40 of the transistor 24 closest to the crystal, the capacitor 43 charges to a voltage which in the preferred embodiment is 2,000 volts. Likewise the capacitor 45 in the middle transistor 25, charges to a voltage of 1,000 volts and the capacitor 47 in the lowermost transistor 26 is charged to ground potential 28. The switch circuit 58 is actuated connecting the side of the capacitor 47 electrically opposite the base 38 of the transistor 26 to ground. In such a condition, the charge across the capacitor 47 of that transistor is 0 volts.

The switching control circuit 58 comprises three switching stages 60–62 wherein the first two stages 60–61 comprise oppositely poled transistor and the third stage 62 comprises a power switching transistor. In the preferred embodiment, the first stage transistor 60 is controlled by a pair of cross coupled NAND gates 64 and 65 forming a flip flop circuit. The circuit may be initiated by a mechanical switch 66 which supplies a low or ground potential 28 to either one of two input gates 68 or 70 of the flip flop.

The first stage transistor 60 in the preferred embodiment is a high speed medium power transistor used as a saturated switch. The second stage transistor 61, which is oppositely poled to the first stage and in the preferred embodiment is a PNP transistor, is a high speed transistor used as switching driver. As will hereinafter be shown, this transistor 61 supplies the proper amount of base current for the third or final stage 62 which is a switching power transistor.

In the initial condition all three stages 60–62 of the switch control network 58 are off or non-conducting. The input switch 66 is positioned, as illustrated in the drawing, for supplying ground potential to one input 68 of the lower NAND gate 65. Both NAND gates 64 and 65 are responsive to logic signals wherein the false level is ground potential and the true level is plus 5 volts. With the switch 66 in a position as shown in the drawing, one input 70 to the upper NAND gate 64 is floating which allows that NAND gate 64 to be controlled by the other input 72. The other input 72 to the upper NAND gate 64 is the output 74 of the lower NAND gate 65 and is at the low level. The output 76 of the upper NAND gate 64 is low which is cross coupled to the second input 78 of the lower NAND gate. The output 76 of the upper NAND gate 64 is also electrically connected through a resistor 80 to a plus 25 volt supply 82. Additionally, the output 76 of the upper NAND gate 64 is connected through a pair of diodes 84 and 85 to the base 86 of the first stage transistor 60. With the output of the upper NAND gate 64 at ground potential, the voltage on the base 86 of the first stage transistor 60 is essentially at ground potential.

To initiate operation of the high voltage pulse circuit, the switch 66 is transferred thereby grounding the floating input 70 of the upper NAND gate 64 switching its output 76 to a true level. As previously indicated, a true level is a signal of plus 5 volts therefore the input to the double diode 84 and 85 connection is also at plus 5 volts. With plus 5 volts on the input to the double diodes, the base-emitter junction of the first stage transistor 60 is forwarded biased causing that transistor 60 to go into conduction. The function of the double diodes 84 and 85 in the base circuit is to insure that the transistor 60 remains in the off or non-conducting state when the output 76 of the upper NAND gate 64 is at a false level. These two diodes accomplish this by preventing any significant value of current from being applied to the base lead 86 of the transistor at this time. In the preferred embodiment, each of the two diodes have a forward voltage drop of 1 volt.

With the first stage transistor 60 in conduction current flows through the collector lead 90 from the two series resistors 92 and 94 in the collector circuit. At the junction of the two series resistors 92 and 94, the base 96 circuit of the second stage transistor 61 is electrically connected.

The second stage transistor 61, as previously indicated, is a PNP transistor wherein the emitter 98 circuit is electrically connected to the plus 25 volt supply 82 and the base 96 circuit is electrically connected through one of the series resistors 92 to the collector 90 of the first stage transistor 60. The collector 100 circuit of the second stage transistor 61 is electrically connected to the base 102 circuit of the third stage transistor 62. When the first stage transistor 60 begins to conduct, the base 96 circuit of the second stage transistor 61 is placed at a potential which forward biases the emitter-base junction of the second stage transistor 61. This brings the second stage transistor into conduction for supplying the large amount of base current necessary to bring the final stage 62 into conduction.

When the collector 100 of the second stage transistor 61 is raised from essentially ground to some positive voltage level, the third stage 62 transistor begins to conduct. An emitter voltage signal which swings from ground to some positive voltage, which in the preferred embodiment is approximately plus 10 volts, is generated and is a-c coupled through the timing capacitor 47 to the base 38 of the first transistor 26 in the high voltage pulse circuit causing that transistor 26 to begin to conduct. As that transistor 26 begins to conduct, the current flows from the collector 104 through the emitter 56 pulling the collector voltage down towards ground potential. As the voltage on the collector 104 is pulled toward ground, the base-emitter junction of the second transistor 25 is forward biased causing that transistor 25 to begin to conduct. Just prior to the instant of conduction, the voltage on the base 37 of the second transistor, as previously indicated, is approximately one-third of the supply voltage 20 or 1,000 volts. Likewise the voltage on the emitter 55 of the second transistor 25 is at the same voltage and as the first transistor 26 begins to conduct, the voltage on that emitter 55 drops causing the base-emitter junction of the second transistor 26 to be forward biased. As soon as the second transistor 25 begins to conduct, the voltage on the emitter 54 of the third transistor 24 drops causing the base-emitter junction of that transistor 24 to be forward biased and that transistor 24 begins to conduct. With all three transistors 24–26 in the state of conduction, the collector 106 electrically nearest the crystal 12 is approximately at ground potential and the voltage drop across the three transistors 24–26 is negligible.

From the previously described component chart, the capacitors 43, 45 and 47 in the base circuits 40–42 begin to discharge with a time constant of approximately 20 microseconds in each base circuit. As soon as the discharge current drops below a base current value necessary to maintain conduction, the transistors 24–26 begin to turn off. As each transistor turns off, the capacitor in its base circuit begins recharging to the voltage of the voltage divider through its respective diode 50–52 to the voltage at the voltage divider 34 and through a common resistor 108 to ground. When all of the transistors 24–26 are fully turned off, the voltage at the junction of each resistor 30–32 in the voltage divider 34 is returned back to its normal value.

When all three transistors 24–26 in the high voltage pulse circuit are all turned off, the switch control circuit 58 may still be in the same state as that which initiated conduction of the pulse circuit. However, even though the third stage 62 of the control circuit is "on", this has no effect on the base circuit 42 of the first transistor 26 in the pulse circuit.

When it is desired, the switch 66 is transferred back to its normal position as shown in the FIGURE. This causes the one input 68 of the lower NAND gate 65 to become low causing the output 74 of that NAND gate to go low which is cross coupled to the other input 72 of the upper NAND gate 64. The one input 70 of the NAND gate 74 resumed its floating potential because the switch 66 has been transferred and the output 76 of the upper NAND gate 64 is then switched from the high to a low signal. Voltage-wise the output of the upper NAND gate 64 is returned to ground potential. This reduces the voltage input to the double diode 84 and 85 in the base circuit of the first stage 60 which causes that transistor to turn off and in succession each succeeding stage 61 and 62 is turned off. The power transistor 62 is likewise turned off causing the emitter circuit of that transistor to return to ground potential. This circuit will return to ground as the charge on the capacitor 47 of the base circuit 42 of the first transistor 26 in the pulse circuit discharges through the emitter resistor 110 of the power transistor. The time constant in this circuit is extremely fast causing that capacitor 47 to discharge relatively quickly. Effectively when the capacitor 47 is completely discharged, the switch control circuit 58 is again ready for effective firing. As in the example of the preferred embodiment, the emitter resistor 110 of the power transistor is a 1,000 ohm resistor and the capacitor 47 in the base circuit of the first transistor 26 of the pulse is 0.47 mfd giving a time constant of approximately 470 microseconds.

As previously indicated, the high voltage pulse circuit is ready for refiring as soon as the output pulse source 12 is recharged. In the preferred embodiment wherein the output pulse source 12 is essentially a piezoelectric crystal, the time between sequential firing of the crystal or discharges of its capacitor is such that the charging resistor 18 has a value of 2 megohm. This is a charging time constant of approximately 6.6 milliseconds and the maximum charging current per crystal is approximately 1½ milliamps. Therefore, in accordance with the objects of the invention, the charging time of the crystal 12 is substantially longer than the discharging time thereby drain on the power supply is minimal. However, the values illustrated in this description are basically a mere matter of selection and are used for illustration purposes only.

What is claimed is:

1. A high voltage semiconductor pulse actuator circuit comprising:

a resistor electrically connected to a source of high voltage;

current storage means electrically connected to said resistor in a charging circuit;

a plurality of switching transistors electrically connected in a series circuit, said series circuit electrically connected to the junction of said resistor and said current storage means for controlling the discharge of said current storage means;

voltage divider means comprising a plurality of high resistant elements electrically connected to said source of high voltage for supplying each of said transistors with a voltage proportional to the voltage value of said source of high voltage;

means electrically connected to said transistors for sequentially turning on said transistors commencing with the transistor electrically farthest from said current storage means for providing a low resistance discharge path for said current storage means when all of said transistors are conducting; and timing means electrically connected in the base circuit of each of said transistors for controlling the period of conduction of said transistors.

2. The high voltage semiconductor pulse actuator circuit according to claim 1 wherein said current storage means is an elongated piezoelectric crystal having a pair of spaced broadsides extending in the direction of length of said crystal.

3. The high voltage semiconductor actuator circuit according to claim 2 wherein said crystal is charged across its broadsides and said crystal contracts in the direction of its length in response to the charge.

4. The high voltage semiconductor pulse actuator circuit according to claim 1 wherein said timing means comprises a plurality of resistor-capacitor timing circuits having their respective timing constants substantially equal wherein each capacitor of said resistor-capacitor timing circuit and initially charged to the voltage applied to this respective transistor by said voltage divider.

* * * * *